(12) United States Patent
Lin

(10) Patent No.: US 6,449,152 B1
(45) Date of Patent: Sep. 10, 2002

(54) DEVICE FOR PRESSING A HEAT SINK TIGHTLY AGAINST A CPU AND POSITIONING A FAN OVER THE HEAT SINK

(76) Inventor: Jen-Cheng Lin, 9 Fl., No. 786, Chung-Cheng Road, Chung-Ho City, Taipei Hsien (TW)

( * ) Notice: Subject to any disclaimer, the term of this patent is extended or adjusted under 35 U.S.C. 154(b) by 0 days.

(21) Appl. No.: 09/985,913

(22) Filed: Nov. 6, 2001

(51) Int. Cl.⁷ .................................................. H05K 7/20
(52) U.S. Cl. .......................... 361/697; 24/457; 24/458; 165/80.3; 248/510; 257/719; 361/704; 361/710
(58) Field of Search .................... 24/457–458; 165/80.2, 165/80.3, 185; 121–122; 174/16.3; 248/505, 510; 257/718–719, 722, 725–727; 361/687, 690, 695–697, 704, 707, 709–710, 715

(56) References Cited

U.S. PATENT DOCUMENTS

| | | | |
|---|---|---|---|
| 5,991,152 A | * 11/1999 | Chiou | 631/704 |
| 6,061,239 A | * 5/2000 | Blomquist | 361/704 |
| 6,880,440 | * 7/2000 | Clemens et al. | 257/719 |
| 6,201,697 B1 | * 3/2001 | Mccullough | 361/704 |
| 6,300,766 B1 | * 11/2001 | Lin et al. | 361/697 |
| 6,332,251 B1 | * 12/2001 | Ho et al. | 165/80.3 |

* cited by examiner

Primary Examiner—Gregory Thompson
(74) Attorney, Agent, or Firm—Fei-Fei Chao; Venable, Baetjer, Howard & Civiletti, LLP

(57) ABSTRACT

A device for pressing a heat sink tightly against a CPU and positioning a fan over the heat sink is disclosed. The CPU is surrounded by a stationary enclosure having a plurality of holes. The device includes a frame to hold the heat sink thereunder and support the fan thereon. A pair of side pieces are arranged at opposite sides of the frame and each piece has lower hooks for engaging with the holes. The frame is movable up and down with respect to the side pieces. A pair of level handles is pivotally connected to the side pieces and each handle has a curved end profiled to urge the frame downward. Therefore, the heat sink is tightly pressed against the CPU once the level handles are turned in predetermined directions after the lower hooks have been engaged with the holes of the enclosure.

9 Claims, 4 Drawing Sheets

DEVICE FOR PRESSING A HEAT SINK TIGHTLY AGAINST A CPU AND POSITIONING A FAN OVER THE HEAT SINK

BACKGROUND OF THE INVENTION

1. Field of the Invention

The present invention relates to a device for pressing a heat sink tightly against a CPU and positioning a fan over the heat sink and, more particularly, to such a device which is applicable to a CPU especially Pentium IV.™

2. Description of Related Art

Accessories for a CPU (Central Processing Unit) include a heat sink and a fan, which are provided for dissipating heat generated by the CPU during its operation. The heat sink is generally held on the CPU, by means of a clip in direct contact with both of them.

A Pentium IV™ CPU is now produced. However, the new CPU is incorporated with a standard stationary enclosure, which prevents the clip from contacting with the CPU.

An additional problem associated with the conventional clip is that it can not position the fan over the heat sink properly. The fan may tremble during the operation of the CPU, making annoying noises time to time.

Therefore, it is an objective of the invention to provide a device for pressing a heat sink tightly against a CPU and positioning a fan over the heat sink to mitigate and/or obviate the aforementioned problems.

SUMMARY OF THE INVENTION

The object of the present invention is to provide a device for pressing a heat sink tightly against a CPU and positioning a fan over the heat sink.

Another object of the present invention is to provide a device applicable to a CPU especially Pentium IV™.

Other objects, advantages and novel features of the invention will become more apparent from the following detailed description when taken in conjunction with the accompanying drawings.

DETAILED DESCRIPTION OF THE PREFERRED EMBODIMENT

Figure 1:
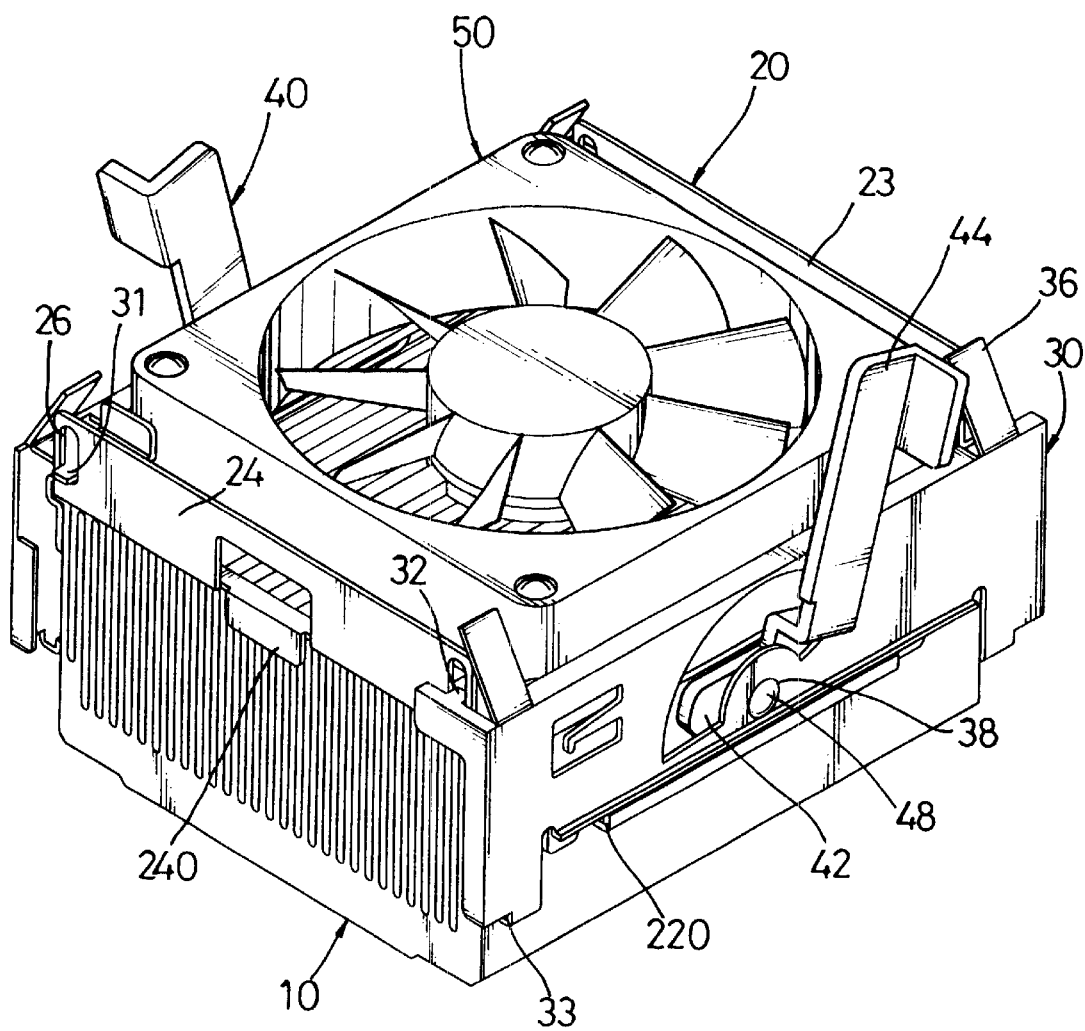
FIG. 1 is a perspective view of a preferred embodiment of a device in accordance with the present invention for pressing a heat sink tightly against a CPU and positioning a fan over the heat sink.

Referring to FIG. 1, there is shown a preferred embodiment of a device in accordance with the present invention for pressing a heat sink (10) tightly against a CPU (not shown) and positioning a fan (50) over the heat sink (10).

Figure 2:
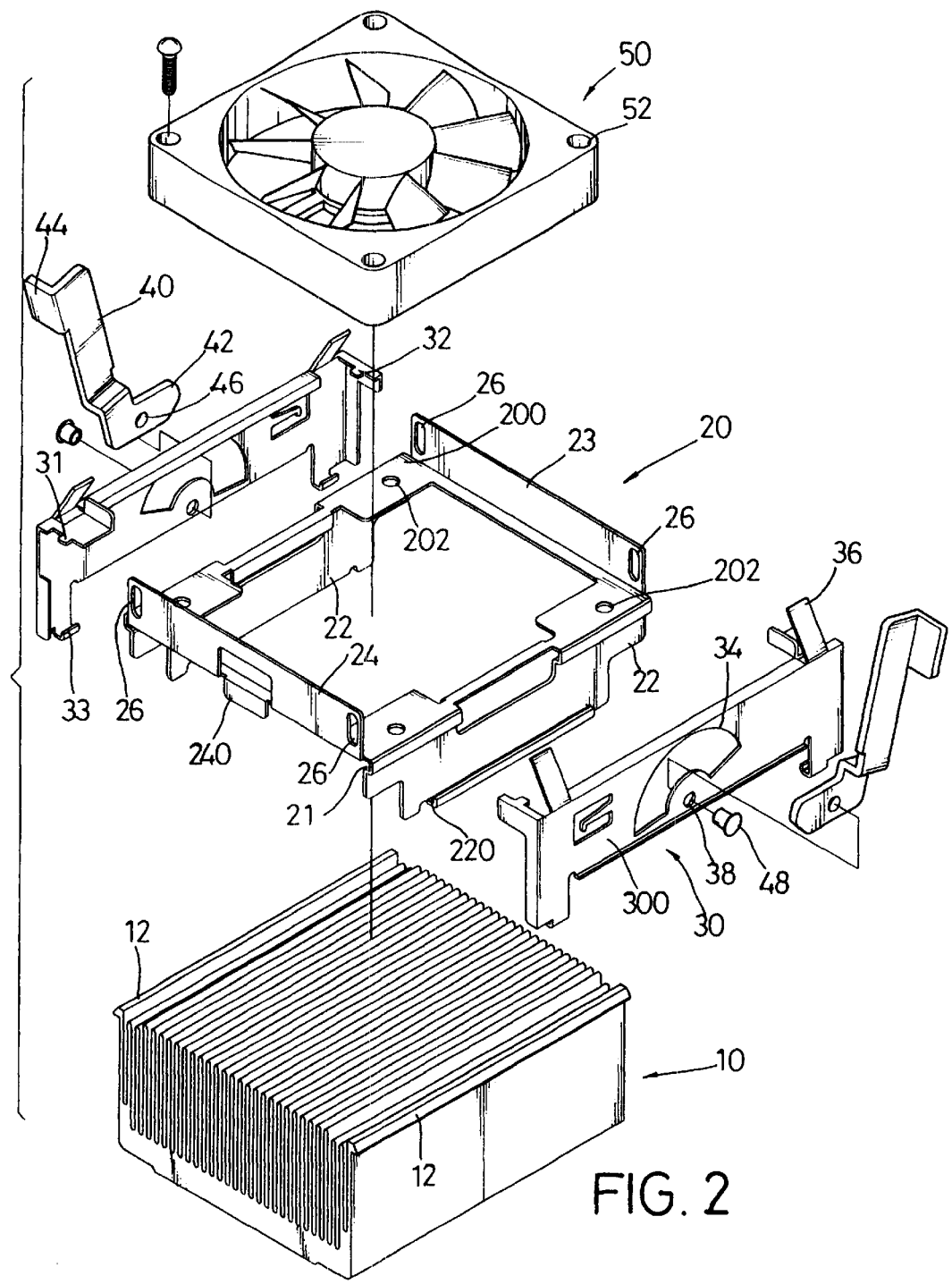
FIG. 2 is an exploded perspective view of the device shown in FIG. 1.

In this embodiment, it is notable that the heat sink (10) has a plurality of fins, as clearly shown in FIG. 2, with two outer ones having lips (12) extending outward therefrom.

Referring to FIG. 2, the device includes a frame (20) to hold the heat sink (10) thereunder yet support the fan (50) thereon. In detail, the frame (20) has a square ring (200) that is formed with a pair of tabs (22) extending downward from its first opposite sides and two lugs (23,24) extending upward from its second opposite sides, with one lug (24) having a stop (240) extending downward below the ring (200).

In the corners of the square ring (200) there are four mounting holes (202) in alignment with respective apertures (52) of the fan (50), thus allowing the fan (50) to be screwed on the ring (200) between the lugs (23,24).

The tabs (22) are preferably designed to slope slightly inward, ending in their lower edges which, however, are bent outward so as to form respective troughs (220). Furthermore, the tabs (22) have a pair of opposed grooves (21) formed at a level immediately below the ring (200) for receiving the lips (12) of the heat sink (10), thereby holding the heat sink (10) under the frame (20) between the tabs (22), as best shown in FIG. 3.

Figure 3:
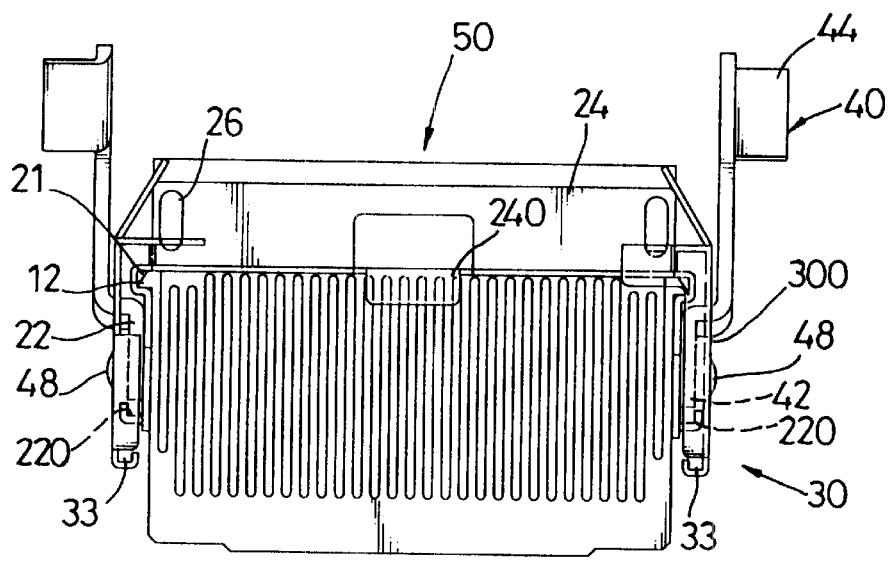
FIG. 3 is a front view of the device shown in Fig. 1.

Referring to FIGS. 2 and 3, arranged at opposite sides of the frame (20) are a pair of side pieces (30), each shaped as an inverted U-shaped escutcheon (300) provided with lower hooks (33). These side pieces (30) must be connected to the frame (20) in such a manner that the frame (20) is movable up and down with respect to the pieces (30).

Such movable connection can be achieved in many ways. For example, the lugs (23,24) may be each formed with upright slots (26) at its two ends, while the side pieces (30) may be formed with upper protrusions (31,32) extending in and movable along the upright slots (26) of the lugs (23,24). This, of course, allows the frame (20) to be movable up and down with respect to the pieces (30).

The side pieces (30) are additionally provided with inclined stops (36) engagable with the tabs (23,24) for a purpose which will be mentioned hereinafter, and with central sector openings (34) through which a pair of level handles (40) extends, as best shown in FIG. 1.

Each of the level handles (40) is pivotally connected to one of the side pieces (30) by means of a pivot (48), which extends through a through-hole (46) defined in the handle (40) and an orifice (38) defined in the piece (30) in a location below the sector opening (34).

Each handle (40) has a curved end (42) and an opposed butt end (44). The curved end (42) is profiled so as to urge the frame (20) downward with respect to the side pieces (30), when the handle (40) is turned about the pivot (48) in a predetermined direction.

Figure 4:
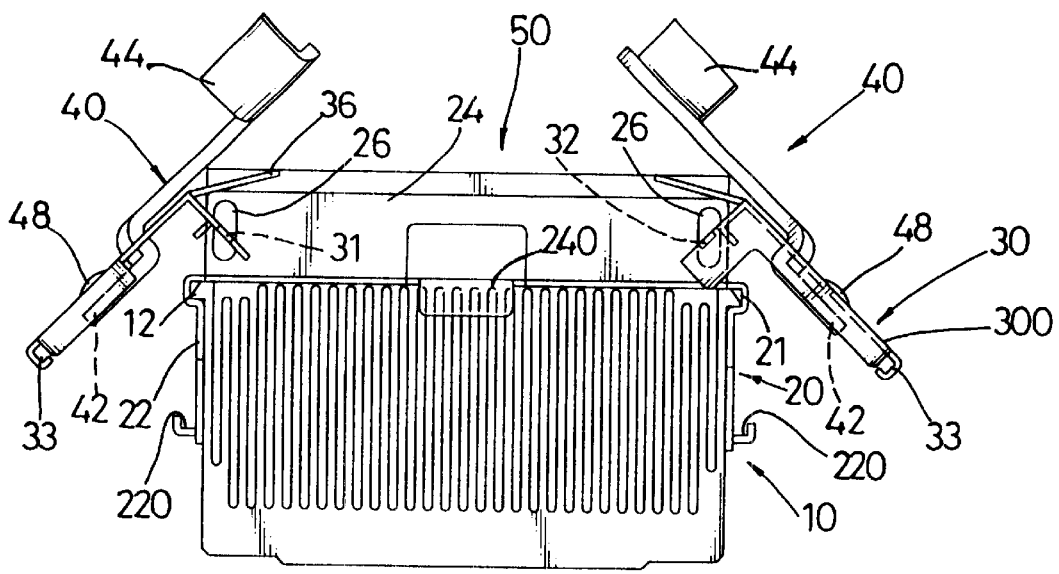
FIG. 4 is a view similar to FIG. 3, but showing a pair of side pieces being out-spread.
Figure 5:
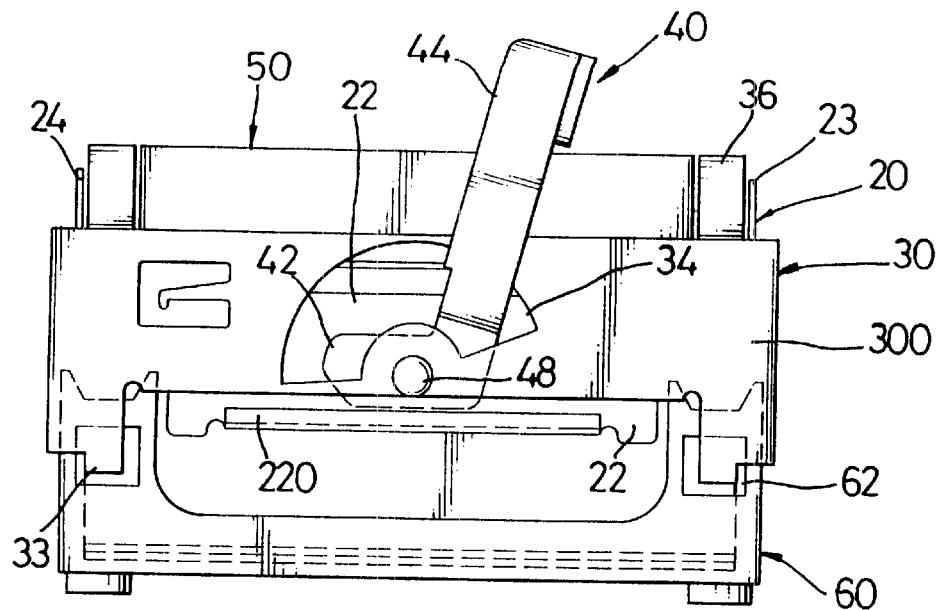
FIG. 5 is a side view of the device of FIG. 1, showing the device being hitched to a stationary enclosure around the CPU, and showing a pair of handles in a first position.
Figure 6:
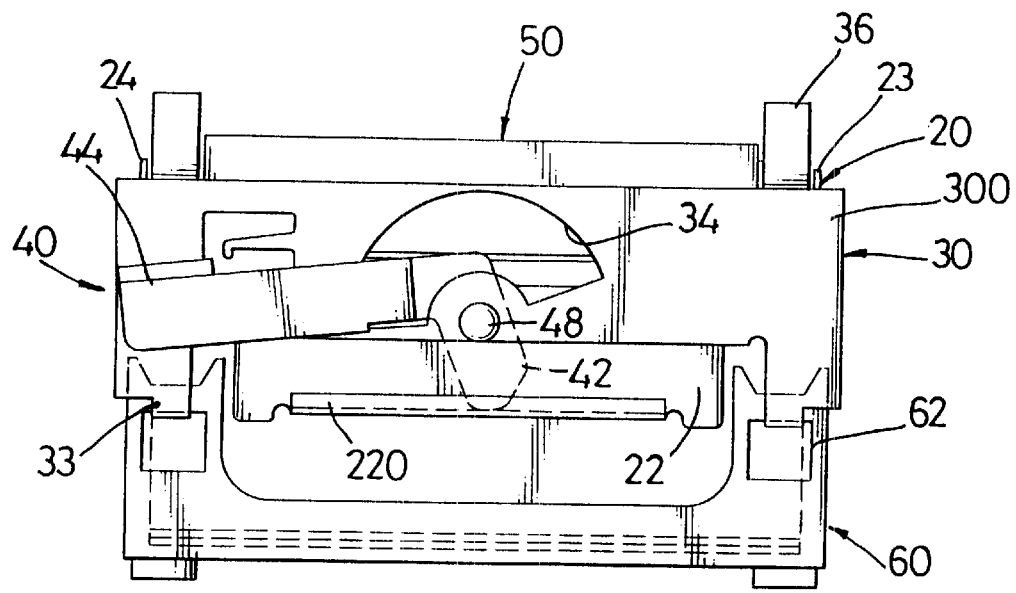
FIG. 6 is a view similar to FIG. 5, but showing the handles in a second position.

Referring to FIGS. 4, 5 and 6, the inventive device is applicable to any CPU, especially Pentium IV™, that is surrounded by a stationary enclosure (60) having a plurality of holes (62).

The application can be achieved by pushing the heat sink (10) into the frame (20) with the lips (12) moved along the grooves (21) until the sink (10) is brought into contact with the stop (240), followed by positioning and screwing the fan (50) to the frame (20).

The side pieces (30) are then out-spread as shown in FIG. 4 and the device is lifted and moved before the heat sink (10) is placed on the CPU. Once the side pieces (30) have been turned down and their lower hooks (33) have been engaged with the holes (62) of the stationary enclosure (60), the level handles (40) are turned in the predetermined directions from a first position as shown in FIG. 5 to a second position as shown in FIG. 6, by pressing or driving the butt ends (44) of the handles (40).

As a result, the curved ends (42) of the handles (40) are driven into the troughs (220) of the frame (20), moving or pressing the frame (20) downward with respect to the sides pieces (30), which are now hitched to the stationary enclosure (60). It is by this way that the heat sink (10) under the frame (20) is tightly pressed on the CPU, while the handles (40) are held motionless in the troughs (220) of the frame (20).

From the above description, it is noted that the invention has the following advantages:

1. applicability to the Pentium IV™ CPU:
    Because the lower hooks (33) are provided, the device is applicable to the Pentium IV™ CPU by engaging the hooks (33) with the holes (62) in the stationary enclosure (60) around the CPU.
2. improvement in the dissipation of heat generated from the CPU:
    Because the heat sink (10) is tightly pressed against the CPU, excellent conduct between them is achieved and hence the dissipation of heat generated by the CPU is excellent.
3. positioning the fan (50) over the heat sink (10) properly:
    Because the fan (50) is screwed to the frame (20), the fan (50) is positioned properly in place and will make no noise during the operation of the CPU.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A device for pressing a heat sink (10) tightly against a Central Processing Unit and positioning a fan (50) over said heat sink (10), said Central Processing Unit being surrounded by a stationary enclosure (60) having a plurality of holes (62), said device comprising:
    a frame (20) configured to hold said heat sink (10) thereunder and support said fan (50) thereon;
    a pair of side pieces (30) arranged at opposite sides of said frame (20), each of said side pieces (30) having lower hooks (33) for engaging with some of said holes (62) of said stationary enclosure (60);
    said frame (20) being movable up and down with respect to said side pieces (30); and
    a pair of level handles (40) pivotally connected to said side pieces (30) respectively, each of said level handles (40) having a curved end (42) profiled to urge said frame (20) downward with respect to said side pieces (30);
    whereby said heat sink (10) is tightly pressed against said Central Processing Unit once said level handles (40) are turned in predetermined directions after said lower hooks (33) of said side pieces (30) have been engaged with said holes (62) of said stationary enclosure (60).

2. The device as claimed in claim 1, wherein said frame (20) includes a square ring (200) to support said fan (50), and a pair of tabs (22) extending downward from first opposite sides of said square ring (200).

3. The device as claimed in claim 2, wherein said heat sink (10) has a pair of outer fins formed with lips (12) extending outward therefrom, and wherein said tabs (22) of said frame (20) have a pair of opposed grooves (21) defined therein for receiving said lips (12), thereby being adapted to hold said heat sink (10) under said frame (20).

4. The device as claimed in claim 3, wherein said frame (20) further includes two lugs (23,24) extending upward from second opposite sides of said square ring (200), and wherein one of said lugs (23,24) has a stop (240) extending downward below said square ring (200).

5. The device as claimed in claim 4, wherein said lugs (23,24) have upright slots (26) defined at ends thereof, and wherein said side pieces (30) have upper protrusions (31,32) extending in and movable along said upright slots (26) of said lugs (23,24), thereby allowing said frame (20) to be movable up and down with respect to said side pieces (30).

6. The device as claimed in claim 2, wherein said tabs (22) of said frame (20) have lower edges bent outward so as to form respective troughs (220), and wherein said curved ends (42) of said level handles (40) are adapted to be held in said troughs (220) of said frame (20).

7. The device as claimed in claim 3, wherein each of side pieces (30) defines a central sector opening (34) through which corresponding one of said level handles (40) extends.

8. The device as claimed in claim 1, wherein said level handles (40) are pivotally connected to said side pieces (30) about respective pivots (48) located below said sector openings (34).

9. The device as claimed in claim 2, wherein said square ring (200) is formed at its corners with mounting holes (202) for said fan (50).

* * * * *